United States Patent
Kunkel

[11] Patent Number: 5,910,639
[45] Date of Patent: Jun. 8, 1999

[54] AIR VENT PANELS FOR ELECTROMAGNETIC SHIELDING

[76] Inventor: George M. Kunkel, 8402 McGroarty, Sunland, Calif. 91040

[21] Appl. No.: 08/999,781

[22] Filed: Mar. 20, 1997

[51] Int. Cl.⁶ .................................................. H05K 9/00
[52] U.S. Cl. .................................. 174/35 MS; 174/35 R
[58] Field of Search .................. 454/184, 257, 454/276; 174/35 R, 35 MS; 428/116, 593; 219/738, 740

[56] References Cited

U.S. PATENT DOCUMENTS 4,851,608  7/1989  Seip ................................... 174/35 MS

FOREIGN PATENT DOCUMENTS 3-131092  6/1991  Japan ................................ 174/35 MS
8401200  11/1985  Netherlands ...................... 174/35 MS

*Primary Examiner*—Harold Joyce
*Attorney, Agent, or Firm*—Donald D. Mon

[57] ABSTRACT

A honeycomb air vent panel for passage of air and for shielding of electromagnetic fields. The honeycomb is formed by metal undulations joined at central segments by an adhesive bond. The ends of the central segments are blended together to form a conductive-bridge between them.

9 Claims, 2 Drawing Sheets

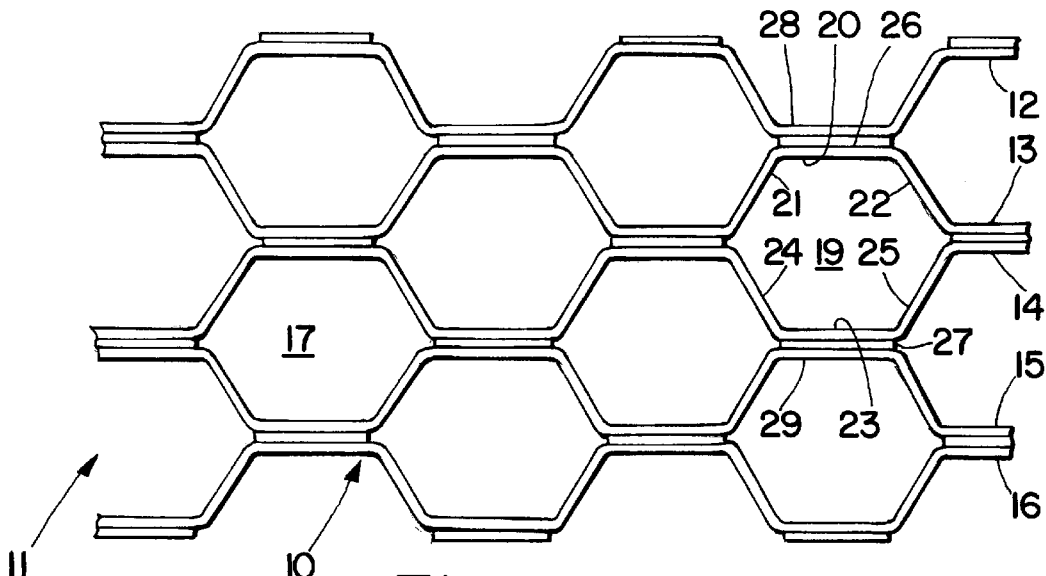
Fig. 1
(PRIOR ART)
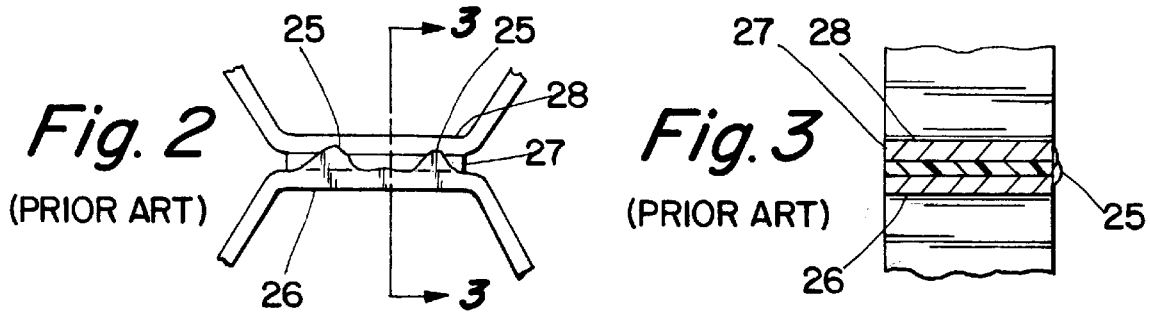
Fig. 2
(PRIOR ART)
Fig. 3
(PRIOR ART)
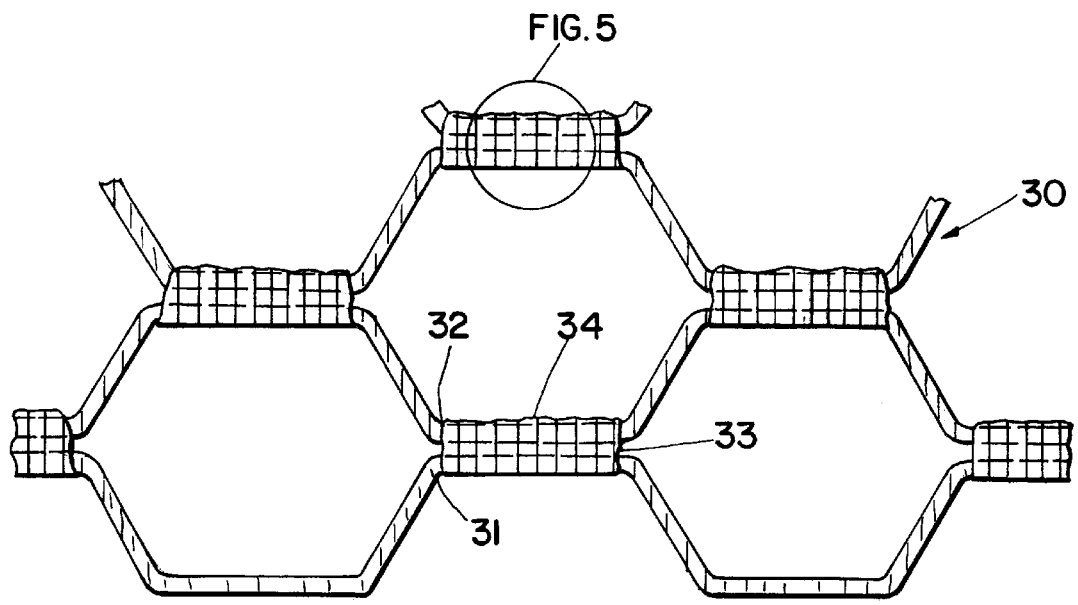
Fig. 4

AIR VENT PANELS FOR ELECTROMAGNETIC SHIELDING

FIELD OF THE INVENTION

Panels to be placed across an air vent which permit flow of cooling air and also provide substantial and reliable electromagnetic shielding.

BACKGROUND OF THE INVENTION

It has long been known that when cost is no object, and the ultimate in electromagnetic shielding of air vents is necessary, hexagonal metal honeycombs which are held together by soldering or welding are the material of choice. Because all abutting surfaces of the undulations of the hexagon that form the honeycomb pattern are held together by a conductive bond, the maximum electromagnetic shielding which can be derived from a body of honeycomb material is in fact attained.

Such material is very costly. Its cost can be justified for very critical installations, especially for military applications where cost is subordinate to reliability and capacity. This is not the situation for most commercial (and also for many military) applications. For example, while an ultimate shielding of about 120 dB at relatively high frequencies (1 GHz) can be attained with soldered or welded-together honeycomb structure, there are many applications where only about 40 to 60 dB is necessary, and in which the cost of soldered or welded honeycomb for the panels cannot be justified.

This is not a new problem, and previous efforts have been made to utilize honeycomb which is constructed of undulations of metal foil which are joined at abutting segments by an epoxy resin. Such foils, without further treatment, do provide some shielding, perhaps as high as 60–70 dB (at 1 GHz) but also as little as 20 dB. This lack of reliability renders the use of such honeycomb filters unuseful for many important applications.

Because the shielding property is increased by conductively joining the undulations together, numerous means conductively to join them have been suggested. One way is to pierce the abutting segments of the undulations with a probe (pin hole) that carries some of the metal from one undulation to its neighbor. This does provide some interconnection between the undulations, but its effect is rather small, and is not uniform, predictable or reliable.

Another means is by electroless nickel-plating the entire honeycomb structure. This will provide, while using an epoxy assembled honeycomb, performance nearly equal to that of a soldered or welded honeycomb. The problem is the cost. The surface area of the honeycomb is large, and therefore so is the cost of nickel-plating it. Due to the cost one is as well off using the soldered or welded honeycomb.

Yet another suggested arrangement is to electroplate the honeycomb structure with a coating such as tin or cadmium. Again the cost is relatively high, although not as high as the cost of a honeycomb whose entire surface has been nickel plated or having the undulations soldered or welded together. This arrangementhas been known to add additional shielding to the honeycomb panel. However, it can also suffer from the acid treatment. If the contact points created by the sawing operation in creating the panels from the honeycomb blocks are etched off, a reduction in the shielding quality of the panel can be significantly reduced (a loss of as much as 40 dB is not unusual).

It is an object of this invention to provide a cost effective honeycomb panel by performing only mechanical processes on the ends of the panel.

Honeycomb panel wafers are formed from slices cut from large blocks of honeycomb by a sawing operation. The teeth of the saw tend to sever the panel, and while they do, some of them pull shard-like portions of one undulation across the epoxy gap, where they touch against the opposite undulation. This provides a few conductive bridges between the abutting undulations. In practice the undulations are aluminum alloy about 0.002 inches thick, and the epoxy bond is about 0.0005 inches thick. However, the presence location and number of these bridges is random and not reliable. Their formation is subject to variations of the sharpness and accuracy of the teeth, the speed of the saw cut and the pressure of the saw against the honeycomb. With so many variables, repetitive consistency is not be anticipated. Still, some improvement in shielding performance is noticeable compared to panel which does not have these bridges.

It is an object of this invention to perform a mechanical finishing operation on the ends of a panel to provide a substantially continuous and reliable metal bridge from one undulation to its neighbor, made of self-material from one of the undulations, thereby "blending" the undulations together at their ends to make a continuous and reliable metallic bridge between them, all of this at a modest cost.

The process reliably produces in a panel, with ⅛ inch cells of about ¼ inches thick, shielding on the order of 70–80 dB at (1 GHz).

BRIEF DESCRIPTION OF THE INVENTION

A shielded air vent panel according to this invention is produced from wafers cut from honeycomb blocks. The honeycomb metal comprises undulations of metal foil that form hexagonal passages. Abutting parallel segments of undulations are joined together by an epoxy resin. The exposed ends of the wafer present a face consisting of a hexagonal pattern of honeycomb metal with segments of epoxy between and joining segments of the undulations which are parallel and in abutment through the epoxy.

According to a feature of this invention, some metal from the end of one of the abutting segments is blended over the epoxy, against and blended into the metal of the other abutting segments. This produces a substantially continuous and integral metallic bridge between each pair of abutting segments, and thereby conductively joins all surfaces of the honeycomb structure to one another.

According to a preferred feature of this invention, the blending is attained by mechanical movement of the bridging material across the epoxy gap. The presently-preferred means for the blending operation is by drawing a lightly abrasive material across the face of the panel, without appreciable removal of metal.

The above and other features of the invention will be fully understood from the following detailed description and the accompanying drawings, in which:

BRIEF DESCRIPTION OF THE DRAWINGS

FIG. 1 is an end view of an idealized panel of honeycomb material;

FIG. 2 is an enlarged fragment of FIG. 1, as it would appear as the consequence of being formed by a sawing operation;

FIG. 3 is a cross-section partly in schematic notation taken at line 3—3 in FIG. 2;

FIG. 4 is an end view of a panel according to this invention, shown partly in schematic notation;

DETAILED DESCRIPTION OF THE INVENTION

Figure 5:
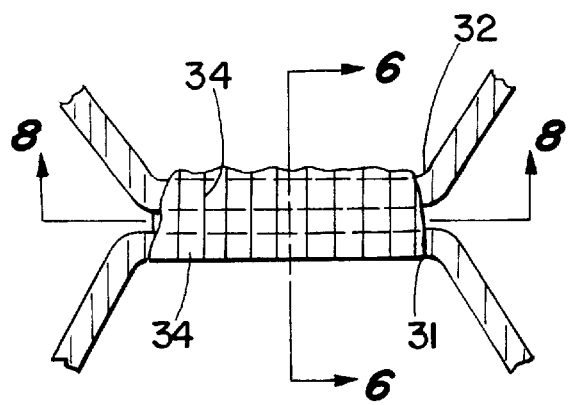
FIG. 5 is an enlarged fragment of FIG. 4.

The end face 10 of a block 11 of honeycomb material used in this invention to provide shielding to electromagnetic field while enabling the flow of cooling air is shown in FIG. 1. This is a conventional material of construction. It comprises a series of undulations, of which five are shown in FIG. 1 for purposes of illustration. These are undulations 12, 13, 14, 15 and 16. The number actually used will be determined by the ultimate dimensions of the air vent opening. It is intended to extend across the air vent opening, with its many axial passages 17 permitting flow of air into the cooling system. Such systems are commonly provided on electronic devices such as computers, which must be kept cool, but which should not be subjected to or emit external electromagnetic fields.

The undulations are made of metal, usually aluminum or an aluminum alloy. They are identical, and are arranged in inverted order. For example, undulations 13 and 14 bound a passage 19 (a specific one of passages 17). Undulation 13 includes a central segment 20 and two side segments 21, 22. Undulation 14 includes a central segment 23 and two side segments 24, 25. Layers 26 and 27 of cured epoxy serve adhesively to bond central segments 20 and 23 to central segments 28 and 29, respectively, of undulations 12 and 15.

Examination of FIG. 1 will illustrate that this adhesive joinder occurs wherever there are abutting central segments throughout the honeycomb structure. The term "abutting" is used, even though a thin layer of epoxy is between the segments. The foil is usually about 0.002 inches thick, and the epoxy is usually about 0.0005 inches thick.

It is evident that in the theoretical structure shown in FIG. 1, each undulation is insulated from its neighbor by epoxy layers. Actually, because those panels are formed by a saw cut made by a very accurate band saw, there will be at least a few tooth tracks across the epoxy layers and their contiguous central segments. This is schematically shown in FIG. 2, where sliver-like pieces 25 of metal from a central segment 26 are tracked across epoxy layer 27 to overlay central segment 28. This contact between the central segments will provide some conductivity between the metal undulations and thus contribute to a shielding property. However, this is minor and highly variable. It cannot be relied on for protection of sensitive equipment.

Figure 6:
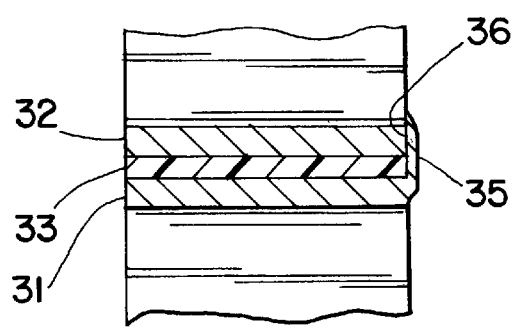
FIG. 6 is a cross-section, partly in schematic notation.

The purpose of this invention is reliably to create a conductive bridge between all abutting central segments, for substantially the full length of these segments. This is accomplished by a mechanical surface treatment to the end face 30 of a block of honeycomb, a portion of which is shown in FIG. 4. As schematically shown in FIGS. 4–6, a mechanical displacement of some metal from one central segment 31 to its neighbor 32 across the intervening epoxy layer 33 has been made. The striated wave-like pattern 34 which results from this treatment is shown on all segments, but is useless for this invention except at the central segments.

As can best be seen in FIG. 6, some metal 35 has been displaced from segment 31, and literally wiped, or smeared onto the epoxy layer and outer segment 32. The resulting contact area 36 provides a conductive connection between the undulations.

This displacement can properly be called "blending" because it tends to blend the metal of one undulation against the metal of the other. While there will be little penetration, still the interface is a tight one caused by pressure and mechanical work, which will now be described.

Figure 7:
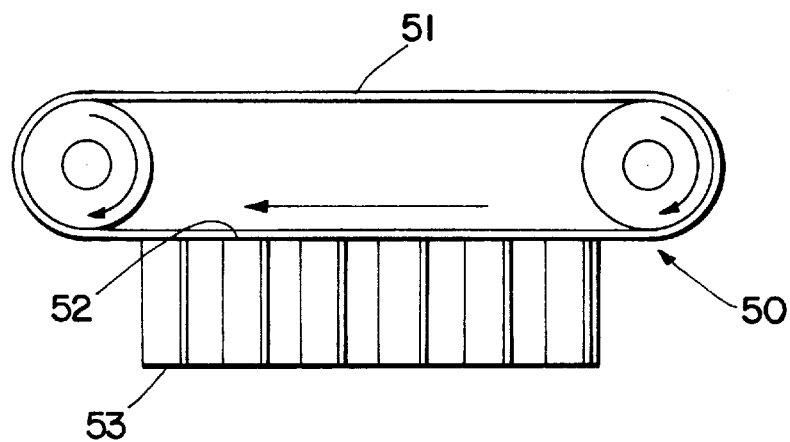
FIG. 7 is a side view, partly in schematic notation, showing the preferred method of making a panel according to the invention.
Figure 8:
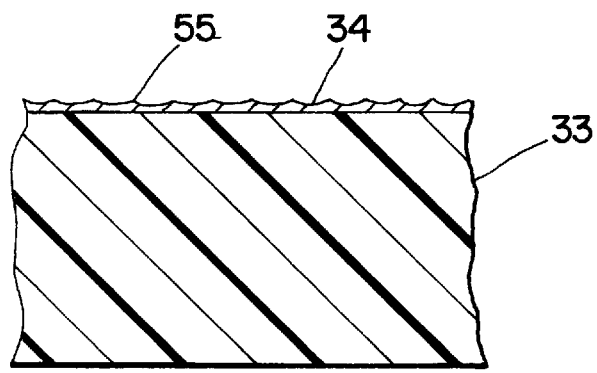
FIG. 8 is a cross-section schematically illustrating the general shape of the surface of the displaced metal.

The honeycomb material is relatively delicate, so that mechanical forces must be exerted with caution. For this invention, as shown in FIG. 7, a typical belt sander 50 drives a continuous belt 51 of blending material. This belt is sometimes called a "pad", because a driven belt is merely the best way to do this procedure. While the pad can be directed in any direction across the face 52 of a wafer 53, it is preferably directed across the grain, that is, normal to the central segments. This will provide the shortest length of useful displacement of material, and the maximum length of contact.

The belt (pad) itself is preferably a non-woven, abrasive, surface blending belt of the type frequently used for providing satin finishes on metal surfaces. Generally these are heavy-duty non-woven nylon belts, impregnated with aluminum oxide grits. A preferred example is the fine series with very very fine 1000 grit sold by 3M Company. However coarse to very fine grits have been shown to work successfully, as coarse as 80 grit. Other types of belts, pads, or blending surfaces may be used instead so long as they create the necessary movement of metal.

The result is to create a striated pattern 55 across the joinder of central segments and epoxy. Viewed in a microscope it appears as a laterally undulating group of raised rounded wave-like ridges. These generally reach and sometimes extend beyond the farther edge of one of the central segments.

It is possible, and occasionally may be desirable to plate the end face so as to plate over the displaced metal. This would provide an additional bridge, based on the metal bridge. Electroless nickel plating is a suitable example.

The blending pad is not intended to remove either metal or epoxy, although it may do so to a small extent. Instead, the metal is to be deformed plastically by engagement of the grits and nylon structure of the pads, and smeared across, leaving a trail of groves atop the displaced metal.

Whatever the exact action is, and its precise nature is not known, the resulting structure provides reliable shielding at a minor manufacturing cost. The explanation given is the best effort to describe the favorable result. of course, both faces are preferably treated for maximum benefit.

This invention is not to be limited by the embodiment showing in the drawings and described in the description, which is given by way of example and not of limitation, but only in accordance with the scope of the appended claims.

I claim:

1. In an air vent panel for passage of air and for shielding of electromagnetic fields comprising a honeycomb body made of a plurality of metal undulations, each having a central segment and two side segments that together form axially extending hexagonally shaped air passages when a plurality of undulations are laid against one another with their central segments in parallel adjacency to one another, said central segments being joined together by an adhesive bond, said body having a laterally cut end face which exposes cross-sections of said undulations and adhesive bonds, the improvement comprising:

a blended displacement of a portion of the exposed cross-section of the central segment of one of said undulations across said adhesive bond and upon said exposed cross-section of the central segment of the other said undulation thereby to form a conductive bridge between said two central segments, said bridge extending for substantially the full length of said central segments.

2. A panel according to claim 1 in which said displacement is a mechanically caused movement of the metal of one of said segments, which exists at substantially all of the pairs of abutting central segments.

3. A panel according to claim 1 in which said displacement substantially normal to the planes of said central segments, which are parallel to one another.

4. A panel according to claim 3 in which said displacement is caused by lateral movement of a blending pad across the said face.

5. A panel according to claim 1 in which said panel has a pair of said faces, both of said faces having said blended conductive bridges.

6. The method of conductively joining the convolutions of a honey comb body at one of its faces, said honeycomb body comprising:

a plurality of metal undulations, each having a central segment and two side segments that together form axially extending hexagonally shaped air passages when a plurality of undulations are laid against one another with their central segments in parallel adjacency to one another, said central segments being joined together by an adhesive bond, said body having a laterally cut end face which expose cross-sections of said undulations and adhesive bonds, said method comprising:

pressing a blending pad against said face while moving it across said face, said blending pad comprising a support body containing a fine grit to engage and displace metal from the central segment of one of said undulations across said adhesive and against the adjacent central segment, whereby to produce a blended displacement of a portion of the exposed end of the central segment of one of said undulations across said adhesive bond and upon said exposed cross-section of the central segment of its adjacent undulation to form a conductive bridge between said two central segments.

7. The method according to claim 6 in which said pad is a non-woven filamentary material incorporating fine abrasive grit.

8. The method according to claim 7 in which said pad is formed as a belt.

9. A panel according to claim 2 in which a layer of conductive metal is deposited over said end face to contact adjacent foils and the displaced metal.

* * * * *